United States Patent [19]

Uchida

[11] 4,327,368
[45] Apr. 27, 1982

[54] CMOS TRANSISTOR PAIR WITH REVERSE BIASED SUBSTRATE TO PREVENT LATCH-UP

[75] Inventor: Yukimasa Uchida, Yokohama, Japan

[73] Assignee: Tokyo Shibaura Denki Kabushiki Kaisha, Japan

[21] Appl. No.: 76,845

[22] Filed: Sep. 19, 1979

[30] Foreign Application Priority Data

Sep. 28, 1978 [JP] Japan .................. 53-118587

[51] Int. Cl.³ .................................. H01L 27/02
[52] U.S. Cl. ...................... 357/42; 357/43; 357/86
[58] Field of Search .................... 357/42, 86, 43

[56] References Cited

U.S. PATENT DOCUMENTS

| | | | |
|---|---|---|---|
| 4,032,952 | 6/1977 | Ohba et al. | 357/42 |
| 4,063,274 | 12/1977 | Dingwall | 357/42 |
| 4,112,670 | 9/1978 | Morozumi | 357/42 |

Primary Examiner—Joseph E. Clawson, Jr.
Attorney, Agent, or Firm—Finnegan, Henderson, Farabow, Garrett & Dunner

[57] ABSTRACT

A complementary type MOS transistor device is disclosed including a p-channel type MOS transistor having source, drain and gate regions formed in the n-well region which is formed in the surface area of a p-type semiconductor layer and an n-channel MOS transistor having source, drain and gate regions formed in said semiconductor layer. The semiconductor layer is formed on an n-type semiconductor body and a reverse bias voltage is applied between the semiconductor layer and the semiconductor substrate.

7 Claims, 3 Drawing Figures

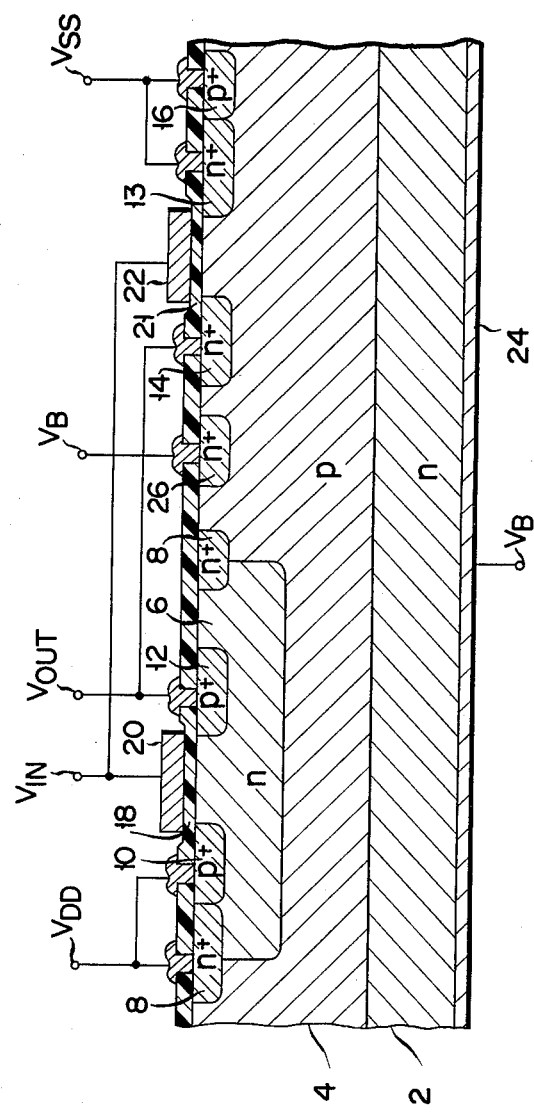
F I G. 3

CMOS TRANSISTOR PAIR WITH REVERSE BIASED SUBSTRATE TO PREVENT LATCH-UP

The invention relates to a semiconductor device having complementary type MOS transistors.

In a conventional integrated circuit (IC) having complementary type transistors, it is known that a parasitic thyristor is formed and a so-called latch-up phenomenon takes place in which external noise or the like may cause the parasitic thyristor to be turned on. Due to the latch-up phenomenon, the operation of the CMOS IC is adversely affected and subject to serious damage. Countermeasures conventionally taken are: (i) an insulator separation method using an insulating layer at necessary portions of the semiconductor device; (ii) a method to form an impurity diffusion region in a semiconductor surface area in order to shut off a current passage between a pnp transistor and an npn transistor within the parasitic thyristor; (iii) a method to reduce a DC current amplification factor of each of those transistors by elongating the effective base lengths of the pnp and npn transistors of the parasitic thyristor; (iv) a method to insert a resistor between a power source and the source of the CMOS transistor. The method (i) is effective for preventing the latch-up phenomenon but requires a very complicated manufacturing process. The method (ii) is insufficient for suppressing the latch-up phenomena. The method (iii) needs a complicated manufacturing process and enlarges the chip area. The method (iv) deteriorates the current drive performance of the CMOS circuit. Those methods are discussed by Kyomasu, et al in an article entitling "Analysis of Latch-Up Phenomenon of CMOS IC" Vol. J61-C, No. 2, p106 in the transactions of the institute of electronics and communication engineers of Japan.

Accordingly, an object of the invention is to provide a semiconductor device having complementary type MOS transistors which is simple in construction and capable of effectively suppressing the latch-up phenonmenon.

According to one aspect of the invention, there is provided a semiconductor device having complementary type MOS transistors comprising a semiconductor substrate of a first conductivity type, a semiconductor layer of a second conductivity type formed on the semiconductor substrate, a well region of the first conductivity type formed in the surface area of the semiconductor layer, first and second semiconductor regions of the first conductivity typed formed in the surface area of the semiconductor layer, and third and fourth semiconductor regions of the second conductivity type formed in the surface area of the well region.

Other objects and features of the invention will be apparent from the following description taken in connection with the accompanying drawings, in which:

This invention can be more fully understood from the following detailed description when taken in conjunction with the accompanying drawings, in which:

FIG. 3 shows a cross sectional view of a semiconductor device which is another embodiment according to the invention.

FIG. 1 shows a cross sectional view of an embodiment of the semiconductor device according to the invention.

Figure 1:
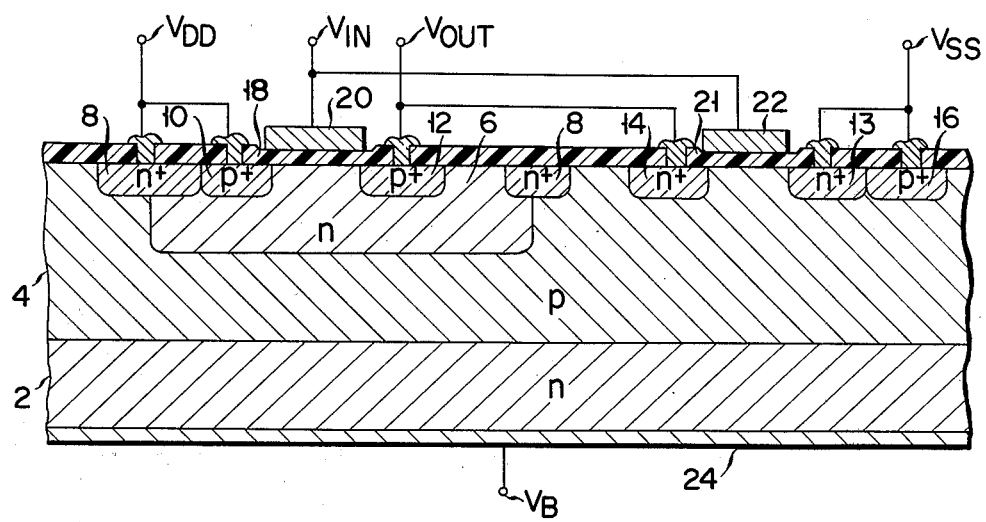
FIG. 1 shows a cross sectional view of a semiconductor device which is an embodiment according to the invention.

The semiconductor device shown in FIG. 1 is provided with an n-type semiconductor substrate 2 and a p-type semiconductor layer 4 with thickness of 20 $\mu$m which is formed on the first surface of the substrate 2 by an epitaxial growth, for example. Impurity concentration of the semiconductor layer 4 is $10^{15}$ atoms/cm$^3$ for example. An n-well region 6 of about 8 $\mu$m in depth is formed in the surface area of the semiconductor layer 4. Impurity concentration of the surface area in the n-well region 6 is $10^{16}$ atoms/cm$^3$, for example. In the surface areas of the n-well region 6 and the semiconductor layer, an n+ type region 8 is formed at the boundary between the n-well region 6 and the semiconductor layer 4 as a guard ring for the n-well region 6.

Further, p+ type regions 10 and 12 used as the source and drain regions of a p-channel MOS transistor are formed in the surface area of the n-well region 6. n+ type regions 13 and 14 used as the source and drain regions of an n-channel MOS transistor are formed in the surface area of the semiconductor layer 4. Additionally, a p+ type region 16 is formed in the surface area of the semiconductor layer 4.

A gate insulating layer 18 and a metal layer 20 are formed in the area between the p+ type regions 10 and 12 and a gate insulating layer 21 and a metal layer 22 are formed in the area between the n+ type regions 12 and 14. Those metal layers 20 and 22 form a gate electrode of the p- and n-channel MOS transistors, respectively. A metal layer 24 is formed on the second surface of the semiconductor substrate 2 opposite to the first surface.

The n+ type region 8 and the p+ type region 10 are commonly connected to a power source terminal $V_{DD}$ of, for example, 10 V. The gate electrodes 20 and 22 are commonly connected to an input terminal $V_{in}$. The n+ type region 14 and the p+ type region 12 are commonly connected to an output terminal $V_{out}$. The n+ type region 13 and the p+ type region 16 are commonly connected to a reference voltage (or a ground terminal) $V_{ss}$. The metal layer 24 is connected to a bias terminal $V_B$ to which a voltage higher than a voltage applied to the surface voltage terminal $V_{SS}$, for example, a positive voltage of 20 V is applied. Accordingly, in the operation of the semiconductor device shown in FIG. 1, a reverse bias voltage is applied between the semiconductor substrate 2 and the semiconductor layer 4.

Figure 2:
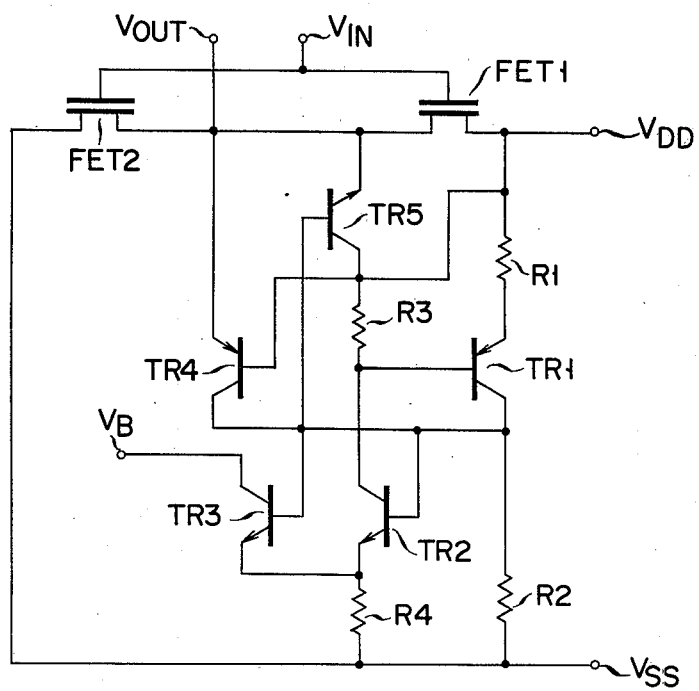
FIG. 2 shows an equivalent circuit of the device shown in FIG. 1.

FIG. 2 shows an equivalent circuit diagram of the semiconductor device illustrated in FIG. 1. In the equivalent circuit in FIG. 2, a complementary MOS transistor circuit includes a p-channel MOS transistor FET1 whose source is connected to a voltage terminal $V_{DD}$ and an n-channel MOS transistor FET 2 whose source is grounded or connected to the power source terminal $V_{SS}$. These transistors FET1 and FET2 are commonly connected at the gates to an input terminal $V_{IN}$ and at the drains to an output terminal. In other words, source, drain and gate of the MOS transistor FET1 are respectively formed of p+ type regions 10 and 12 and the gate electrode 20 shown in FIG. 1. The source, drain and gate of the MOS transistor FET2 are formed by n+ regions 13 and 14 and the gate electrode 22.

The circuit shown in FIG. 2 further includes a pnp transistor TR1, an npn transistor TR2, a npn transistor TR3, a pnp transistor TR4 and an npn transistor TR5. The pnp transistor TR1 has an emitter connected to the power source terminal $V_{DD}$ through a resistor R1, a collector connected to the power source terminal $V_{SS}$ through a resistor R2, and a base connected to the power source terminal $V_{DD}$ through a resistor R3. The npn transistor TR2 has a base and a collector which are connected to the collector and base of the transistor TR1, respectively, and an emitter connected through a resistor R4 to the power source terminal $V_{SS}$. The npn transistor TR3 has a base and an emitter which are connected to the base and the emitter of the transistor TR2, respectively, and a collector connected to the power source terminal $V_B$. The pnp transistor TR4 has a base, a collector and an emitter which are respectively connected to the power source terminal $V_{DD}$, the collector of the transistor TR1 and the output terminal $V_{out}$. The npn transistor TR5 has a collector, an emitter and a base which are respectively connected to the power source terminal $V_{DD}$, the output terminal $V_{out}$ and the collectors of the transistors TR1 and TR4. The pnp transistor TR1 is formed of the p+ type region 10, the n-well region 6, and the p-type semiconductor layer 4 shown in FIG. 1. The npn transistor TR2, is formed of the n+ type region 13, the p-type semiconductor layer 4, and the n-well region 6. The npn transistor TR3 is formed of the n+ type region 13, the p-type semiconductor layer 4, and the n+ type semiconductor substrate 2. The pnp transistor TR4 is formed of the p+ type region 12, the n-well region 6, and the p type semiconductor layer 4. The npn transistor TR5 is formed of the n+ type region 14, the p type semiconductor layer 4, and the n-well region 6.

Latch-up phenomenon takes place when the vertical pnp transistor TR1 and the lateral npn transistor TR2 are both conductive and a pnpn thyristor formed of the p+ type region 10, the n-well region 6, the p type semiconductor layer 4 and the n+ type region 13. The thyristor is turned on in a manner that carriers injected into the n-well region 6 and the p-type semiconductor layer 4 through the emitters of the transistors TR4 and TR5 due to spike noise or the like introduced from the terminal $V_{out}$, for example, or carriers excited in the n-well region 6 and the p-type semiconductor layer due to temperature rise and light cause the transistors TR1 and TR2 to be turned on.

In the equivalent circuit shown in FIG. 2, a condition under which the latch-up phenomenon takes place, that is, the transistors TR1 and TR2 are conductive, is $$\frac{\alpha 1 R3}{R3 + R1} + \frac{\alpha 2 R2}{R2 + R4} = 1 + \frac{I_{B3}}{I_{B2}} (1 - \alpha_2) \left(1 - \frac{\alpha 1 R3}{R3 + R1}\right)\left(1 + \frac{\alpha 3 R4}{(1 - \alpha 3)(R2 + R4)}\right).$$

where α1, α2 and α3 are current amplification factors of the transistors TR1 to TR3, and $I_{B2}$ and $I_{B3}$ are base currents of the transistors TR2 and TR3, respectively.

Note here that, when no n-type semiconductor substrate 2 is used and no inverse bias voltage is applied between the n-type semiconductor substrate 2 and the p-type semiconductor layer 4, the right side of the equation (1) is equal to 1.

In the semiconductor device shown in FIG. 1, when $V_{DD}=10$ V, $V_B=20$ V and $V_{SS}=0$ V, electrons are injected into the p-type semiconductor layer 4 through the source region 13 of the n-channel MOS transistor and most of the electrons flow into the n-type semiconductor substrate 2 while few electrons flow into the n-well region 6. Therefore, $1 > \alpha 3 > \alpha 2$, and the second term on the right side of the equation (1) becomes a relatively large value. This makes it extremely difficult to hold the equation (1). In other words, the latch-up phenomenon is effectively suppressed in its occurance.

FIG. 3 shows a cross sectional view of a semiconductor device which is an embodiment according to the invention. The semiconductor device shown in FIG. 3 is the same as that of FIG. 1, except that an n+ type region 26 is additionally formed in the surface region of a p-type semiconductor layer 4. The n+ type region 26 is coupled with a power source terminal $V_B$ and absorbs electrons injected into the p-type semiconductor layer 4 through the source region 13 of the n-channel MOS transistor. Therefore, a smaller number of electrons injected into the p-type semiconductor layer 4 flow into the n-well region 6, compared to the case of the semiconductor device shown in FIG. 1. Accordingly, the second term on the right side of the equation (1) further increases. Accordingly, the semiconductor device shown in FIG. 2 more effectively suppresses the occurance of the latch-up phenomenon. Although a specific construction has been illustrated and described with reference to the embodiments, it is not intended that the invention be limited to those embodiments. For example, unlike the above-mentioned embodiment of the CMOS device having the n-well region, the CMOS device having a p-well region may be used with each semiconductor region of which the polarity is reversed. Although the CMOS inverter circuit is described in the above-mentioned embodiment, the invention is applicable for other CMOS circuits and the CMOS memory or the like. Further, $=V_B = \leq = V_{DD}=$ is allowed in the invention, although $=V_B = > = V_{DD}=$ holds in the above-mentioned embodiment.

What is claimed is:

1. A semiconductor device comprising:
a semiconductor substrate of a first conductivity type;
a semiconductor layer having a second conductivity type opposite to said first conductivity type and formed on said semiconductor substrate;
a well region of the first conductivity type formed in the surface area of said semiconductor layer to a depth which avoids contact with said semiconductor substrate;
first and second semiconductor regions of the first conductivity type formed in the surface area of said semiconductor layer;
third and fourth semiconductor regions of a second conductivity type formed in the surface area of said well region;
a first gate electrode insulatively formed on that surface area of said semiconductor layer which lies between said first and second semiconductor regions to form a first transistor;
a second gate electrode insulatively arranged on that surface area of said well region which lies between said third and fourth semiconductor regions to form a second transistor;
means for interconnecting said first and second transistors to form a complementary metal oxide semiconductor inverter; and
means for applying a reverse bias voltage between said semiconductor substrate and semiconductor layer to prevent latch-up of said inverter.

2. A semiconductor device according to claim 1, further comprising:

a guard ring surrounding said well region; and a fifth semiconductor region of the first conductivity type formed in the surface area of said semiconductor layer to which a reverse bias voltage is applied with respect to said semiconductor layer.

3. A semiconductor device according to claim 2, wherein said fifth semiconductor region is disposed between said well region, and said first and second semiconductor regions.

4. A semiconductor device according to claim 2, wherein said fifth semiconductor region is kept at the same potential as that of the semiconductor substrate.

5. A semiconductor device comprising:

a semiconductor substrate of a first conductivity type;

a semiconductor layer having a second conductivity type opposite to said first conductivity type and formed on said semiconductor substrate;

a well region of the first conductivity type formed in the surface area of said semiconductor layer to a depth which avoids contact with said semiconductor substrate;

first and second semiconductor regions of the first conductivity type formed in the surface area of said semiconductor layer;

third and fourth semiconductor regions of a second conductivity type formed in the surface area of said well region;

a first gate electrode insulatively formed on the surface area of said semiconductor layer which lies between said first and second semiconductor regions to form a first transistor;

a second gate electrode insulatively arranged on that surface area of said well regions which lies between said third and fourth semiconductor regions to form a second transistor;

means for interconnecting said first and second transistors to form a complementary metal oxide semiconductor inverter;

a guard ring surrounding said well region; and a fifth semiconductor region of the first conductivity type formed in the surface area of said semiconductor layer to which a reverse bias voltage is applied with respect to said semiconductor layer.

6. A semiconductor device according to claim 5, wherein said fifth semiconductor region is disposed between said well region, and said first and second semiconductor regions.

7. A semiconductor device according to claim 5, wherein said fifth semiconductor region is kept at the same potential as that of the semiconductor substrate.

* * * * *